US011062935B2

(12) United States Patent
Fridman et al.

(10) Patent No.: US 11,062,935 B2
(45) Date of Patent: Jul. 13, 2021

(54) LOW PROFILE WAFER MANIPULATOR

(71) Applicant: KLA Corporation, Milpitas, CA (US)

(72) Inventors: Alexander Fridman, Haifa (IL); Andrey Yakovlev, Haifa (IL); Michael Brisman, Ellit (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/533,743

(22) Filed: Aug. 6, 2019

(65) Prior Publication Data

US 2020/0043774 A1 Feb. 6, 2020

Related U.S. Application Data

(60) Provisional application No. 62/715,109, filed on Aug. 6, 2018.

(51) Int. Cl.
*H01L 21/67* (2006.01)
*H01L 21/687* (2006.01)

(52) U.S. Cl.
CPC .. *H01L 21/68707* (2013.01); *H01L 21/67259* (2013.01)

(58) Field of Classification Search
None
See application file for complete search history.

(56) References Cited

U.S. PATENT DOCUMENTS

| 5,271,702 A * | 12/1993 | Dobbs | H01L 21/68707 414/217 |
| 5,796,486 A * | 8/1998 | Jacob | H01L 21/67259 356/614 |
| 9,698,035 B2 * | 7/2017 | Rodnick | H01L 21/677 |
| 2007/0137279 A1 * | 6/2007 | Jang | H01L 21/68707 72/405.12 |

* cited by examiner

*Primary Examiner* — Ronald P Jarrett
(74) *Attorney, Agent, or Firm* — Huse IP Law; Charles C. Huse

(57) ABSTRACT

A wafer manipulator includes a first arm connected to a base, a second arm connected to the base, a first pad connected to the first arm, a second pad connected to the second arm, a light transmitter connected to the wafer manipulator, and a light sensor connected to the wafer manipulator. The light sensor is configured to receive light transmitted from the light transmitter when the wafer is not properly in contact with the wafer. The light sensor is configured to not receive light transmitted from the light transmitter when the wafer is properly in contact with the wafer manipulator. The first pad has a horizontal friction and a vertical friction. The horizontal friction is at least ten times greater than the vertical friction. Multiple pads can be attached to the first arm and multiple pads can be attached to the second arm.

20 Claims, 6 Drawing Sheets

WAFER MANIPULATOR (PERSPECTIVE VIEW)

WAFER MANIPULATOR (PERSPECTIVE VIEW)

WAFER MANIPULATOR (TOP-DOWN VIEW)

WAFER MANIPULATOR (SIDE VIEW)

SENSOR ASSEMBLY

WAFER MANIPULATOR FLOWCHART

WAFER SENSING FLOWCHART

LOW PROFILE WAFER MANIPULATOR

CROSS REFERENCE TO RELATED APPLICATIONS

This application claims priority under 35 U.S.C. § 119 from U.S. Provisional Application No. 62/715,109, entitled "APPLICATION OF PASSIVE FRICTION END EFFECTOR THAT USES GECKO MATERIAL PADS AND END EFFECTOR SUPPORT WITH THROUGH BEAM PRESENCE AND PLACEMENT SENSOR," filed on Aug. 6, 2018, the subject matter of which is incorporated herein by reference.

TECHNICAL FIELD

The described embodiments relate generally to wafer manipulation and more particularly to wafer manipulation for low profile applications.

BACKGROUND INFORMATION

Wafer manipulation is often performed using edge gripping or vacuum gripping. Edge gripping systems are not able to work with nominal SEMI standard cassettes with 6.35 mm pitch due to high end effector thickness. Vacuum handling systems are not able to work with defined substrates due to the requirement that the wafer is only contacted within the narrow edge region of the wafer. Vacuum handling systems require larger area to connect to the wafer, which extends outside of the wafer edge area. An improved method and apparatus for wafer manipulation is needed.

SUMMARY

In a first novel aspect, a wafer manipulator includes a first arm connected to a base, a second arm connected to the base, a first pad connected to the first arm, a second pad connected to the second arm, a light transmitter connected to the wafer manipulator, and a light sensor connected to the wafer manipulator.

In a second novel aspect, the light sensor is configured to receive light transmitted from the light transmitter when the wafer is not properly in contact with the wafer.

In a third novel aspect, the light sensor is configured to not receive light transmitted from the light transmitter when the wafer is properly in contact with the wafer manipulator.

The first pad has a horizontal friction and a vertical friction, wherein the horizontal friction is at least ten times greater than the vertical friction.

In a first example, the first pad is connected to the first arm using adhesive.

In a second example, the first pad is connected to the first arm using a bolt, a screw, a nail, a pin, a lock, or a rivet.

In another example, the light transmitter includes a Light Emitting Diode (LED).

Multiple pads can be attached to the first arm and multiple pads can be attached to the second arm.

The light transmitter and the light sensor are configured such that light transmitted from the light transmitter is blocked by the wafer before irradiating the light sensor when the wafer is properly in contact with the wafer manipulator.

The light transmitter and the light sensor are configured such that light transmitted from the light transmitter is not blocked by the wafer before irradiating the light sensor when the wafer is not properly in contact with the wafer manipulator.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, relational terms such as "top", "down", "upper", "lower", "top", "bottom", "left" and "right" may be used to describe relative orientations between different parts of a structure being described, and it is to be understood that the overall structure being described can actually be oriented in any way in three-dimensional space.

Warped wafer handling is an important area and is gaining increasing importance in semiconductor industry. Two-hundred millimeter wafers are being used in new advanced packaging as well as mobile and automotive applications that use thinner, more warped wafers. For example, picking and placing of two-hundred millimeter wafers of three-hundred and fifty to thirteen-hundred micrometers thickness with warping of up to three-hundred micrometers. Across the manufacturing process, substrates are randomly warped and have randomly varying thicknesses. Another complexity is that substrates cannot be contacted on the backside more than two millimeters from its edge. Substrates are required to be handled in cassettes with pitch of 6.35 millimeters, which limits the maximum thickness of an end effector that supports a wafer during transport.

Previous methods used in this area include an edge gripping method that requires that wafer only be placed every other slot in a wafer stack so that the edge gripping machine has sufficient space to grab one wafer without coming into contact with another wafer and causing wafer damage. This inability to utilize every wafer slot greatly decreases the rate at which wafers can be processed.

Figure 1:
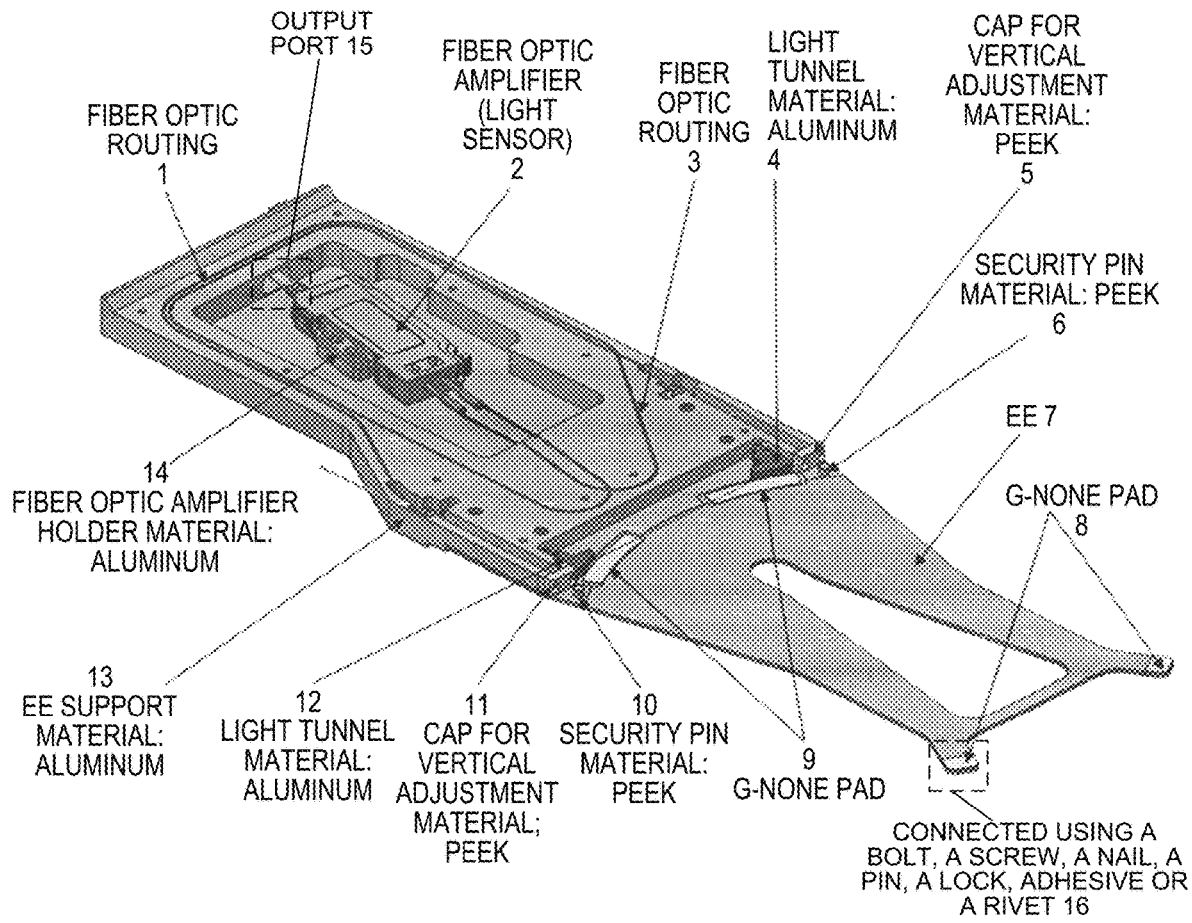
FIG. 1 is a diagram illustrating a perspective view of a wafer manipulator.

FIG. 1 is a diagram illustrating a perspective view of a wafer manipulator. The wafer manipulator includes fiber optic routing 1, fiber optic amplifier 2, fiber optic routing 3, light tunnel 4, cap for vertical adjustment 5, security pin 6, End Effector (EE) 7, G-NONE pads 8 and 9, security pin 10, cap for vertical adjustment 11, light tunnel 12, End Effector (EE) support 13, and fiber optic amplifier 14.

In one example, the pads 8 and 9 are Gecko-material pads that are constructed by many fibers. The friction between the fibers and a wafer that is in contact with the fibers varies depending on the angle of fibers relative to the surface of the wafer.

In second example, the fibers of the Gecko-material pads hold the wafer on a moving robot end effector and "set" into the fibers is done as the end effector moves away. Inertia or centrifugal force may generate motion of the wafer relative to the end effector (i.e. slippage). Any slippage will set the fibers and lock Gecko-material pads the wafer down.

In another example, the Gecko-material is Cylium and the horizontal friction of the Gecko-material is at least ten times greater than the vertical friction of the Gecko-material.

In yet another example, construction of a wafer manipulator may include several parts. An end effector may have three or four passive Gecko-material pads, which are attached to a stainless steel made plate with total thickness of two millimeters. The end effector also includes two PEEK security pins which limit wafer offset in negative direction (see FIG. 1). The pads may be connected by high adhesive backside tape in specially designed places. A respective G-NONE pad 8 may be connected to a respective arm using a bolt, a screw, a nail, a pin, a lock, adhesive, or a rivet 16. Gecko-material pads allow the wafer to be moved at extremely high velocity profiles while maintaining the wafer connection with the wafer manipulator, which improves throughput of the wafer manipulator. A wafer manipulator may also be referred to as a wafer handler. The Gecko-material pads flexibility allows the wafer manipulator to handle wafers with warping of up to three-hundred micrometers, which is highly desirable because wafer materials have different degrees of warping across production. The Gecko-pad design is made in such way that has high friction coefficient in lateral (x-y direction) and low friction coefficient in vertical (z-direction). The end effector support is constructed using aluminum designed construction. Recognition of wafer presence and placement is performed by a through beam sensor, wherein a light beam is broken when the wafer manipulator is properly in contact with a wafer. Design of sensors assembly allows its adjustment in several degrees of freedom: rotational, height (z-direction) and lateral (forward and back, also called R-direction in Robotics).

The wafer manipulator may also include an output port 15 that outputs a signal that is indicative of the light received by the light sensor.

Figure 2:
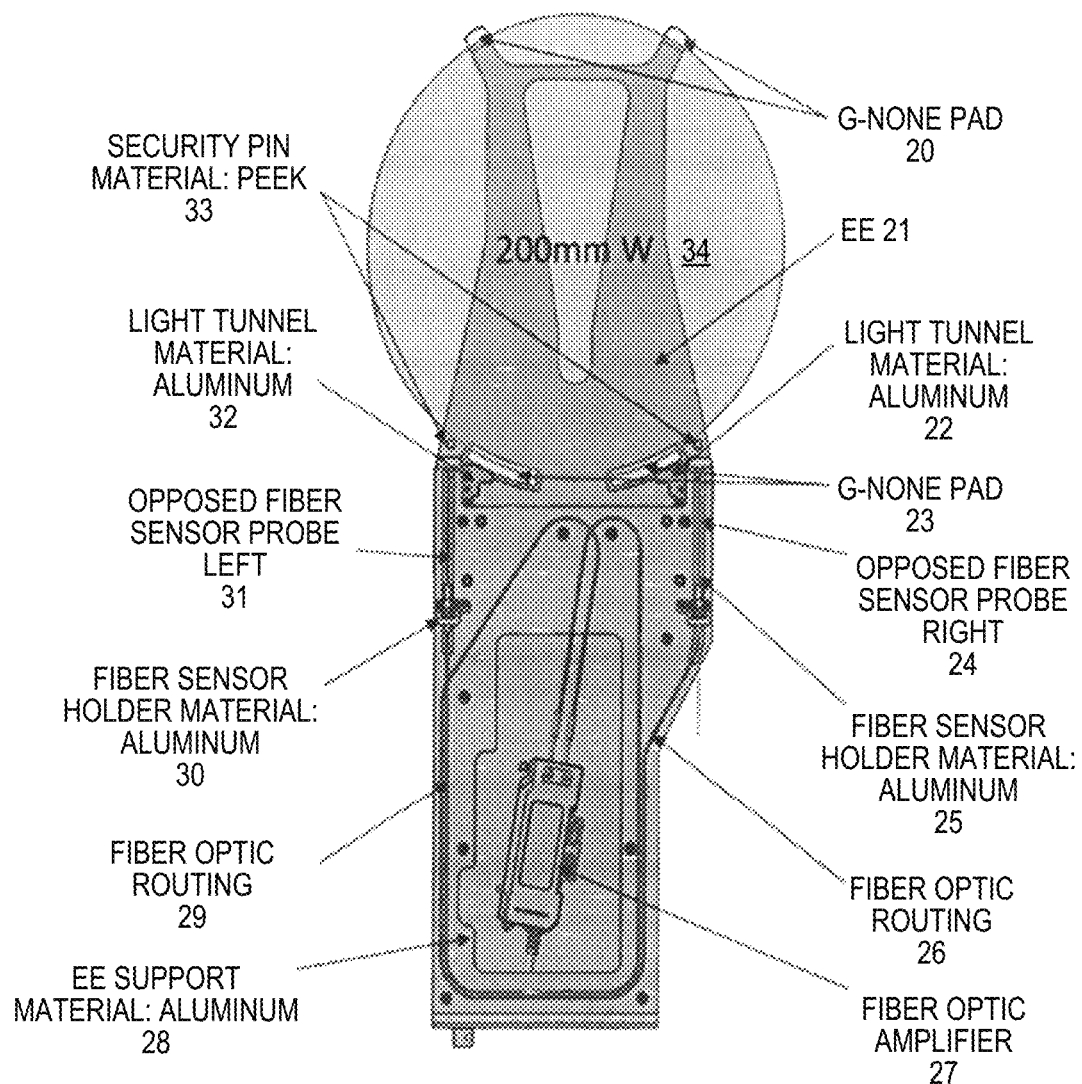
FIG. 2 is a diagram illustrating a top-down view of a wafer manipulator.

FIG. 2 is a diagram illustrating a top-down view of a wafer manipulator handling a 200 mm wafer 34. The wafer manipulator includes G-NONE pads 20, End Effector (EE) 21, light tunnel 22, G-NONE pads 23, opposed fiber sensor probe right 24, fiber sensor holder 25, fiber optic routing 26, fiber optic amplifier 27, End Effector (EE) support, fiber optic routing 29, fiber sensor holder 30, opposed fiber sensor probe left 31, light tunnel 32, and security pin 33.

Figure 3:
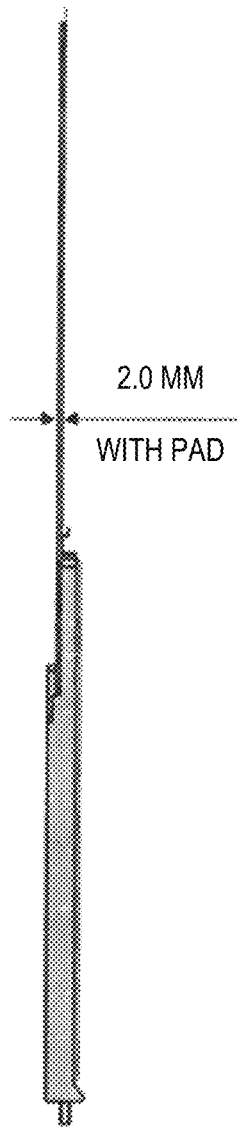
FIG. 3 is a diagram illustrating a side view of a wafer manipulator.

FIG. 3 is a diagram illustrating a side view of a wafer manipulator. The end effector of the wafer manipulator has a vertical height of two millimeters. The low profile of the wafer manipulator allows manipulation of wafers stacked more closely together, which in turn increases wafer processing throughput.

Figure 4:
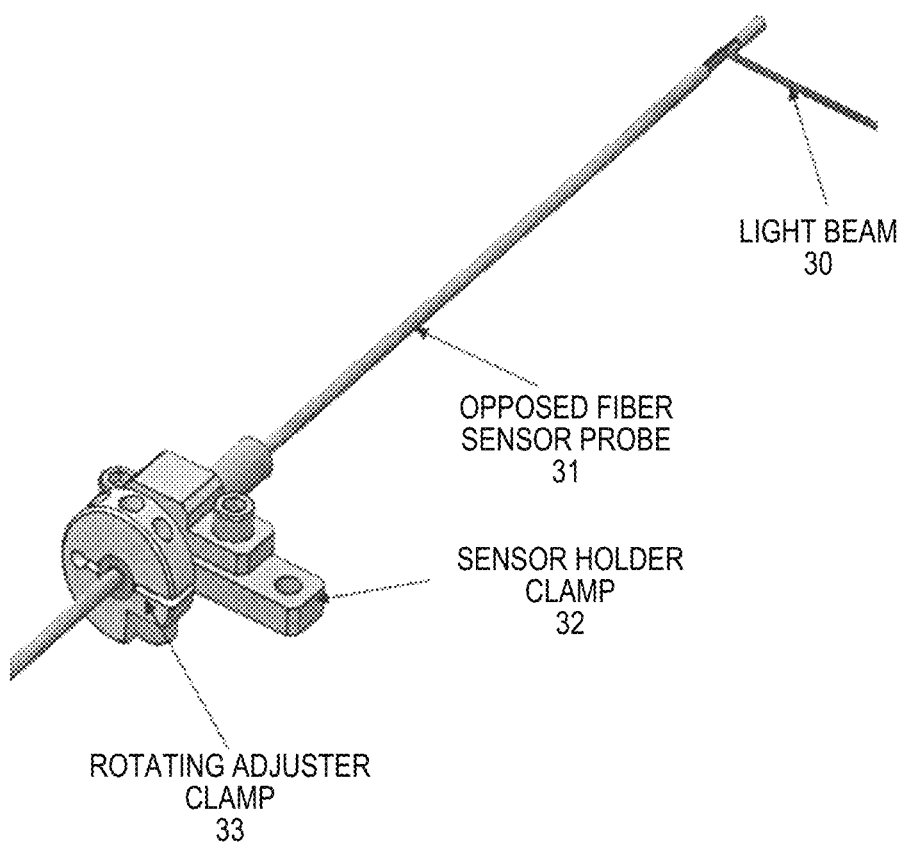
FIG. 4 is a diagram illustrating a perspective view of a sensor assembly.

FIG. 4 is a diagram illustrating a perspective view of a sensor assembly. The sensor assembly includes a routing adjuster clamp 33, a sensor holder 32, and an opposed fiber sensor probe 31. Light beam 30 irradiates the sensor assembly and is then routed to a fiber optic amplifier.

In one example, the wafer manipulator is controlled by a robot. A robot may include a computer and apparatus for causing the robot to move itself and to move the wafer manipulator. The robot with installed passive friction end effector subassembly moves towards taught position. When the arm gets to taught position (Gecko-Material pads are in contact with edge of wafer), sensor switches its state from "absent" to "present". Since pads are in contact with wafer substrate, robot can handle wafer to any defined position without losing it. If during robot motion with wafer loaded there is relative wafer displacement (wafer loss) which is higher than defined spec, then sensor will switch its status to "absent" and system will stop. When robot with wafer loaded on its arm gets to the defined station where wafer unloading is desired, the arm starts to move down towards station teach position to unload the wafer. Given that there is virtually no adhesion (friction) in z-direction between the wafer and the pads (due to pads material design and absence of other normal forces such as those caused by vacuums or grips), once the wafer is placed on the station there is no additional tension or force between pads and wafer. The robot arm moves down until downward offset teach position and then verifies sensor status. If the wafer is absent, then the robot continues to operate.

This wafer manipulator design allows:

Handling wafers with up to three-hundred micrometers of warping.

Handling wafers with use of twenty-five slot cassettes with a pitch of 6.35 millimeters.

Handling wafers while only contacting up to two millimeters of the wafer backside, which avoids wafer contamination and force applied to products placed on the backside of the wafer.

No need to use vacuum systems that cannot limit contact to within the wafer edge handling area.

Wafer handling can be done with nominal fast motion profile.

Wafer handling can be performed without application of any additional force (only gravitational force is applied to the wafer—unlike vacuum or grip handling).

Verify presence and placement of wafers with thickness between three-hundred and fifty micrometers and thirteen-hundred micrometers.

Verify presence and placement of wafers with placement offset according to specified definition.

Sensor design allows almost zero time for wafer presence/absence verification comparatively to existing systems where verification time is a function of vacuum build time.

Figure 5:
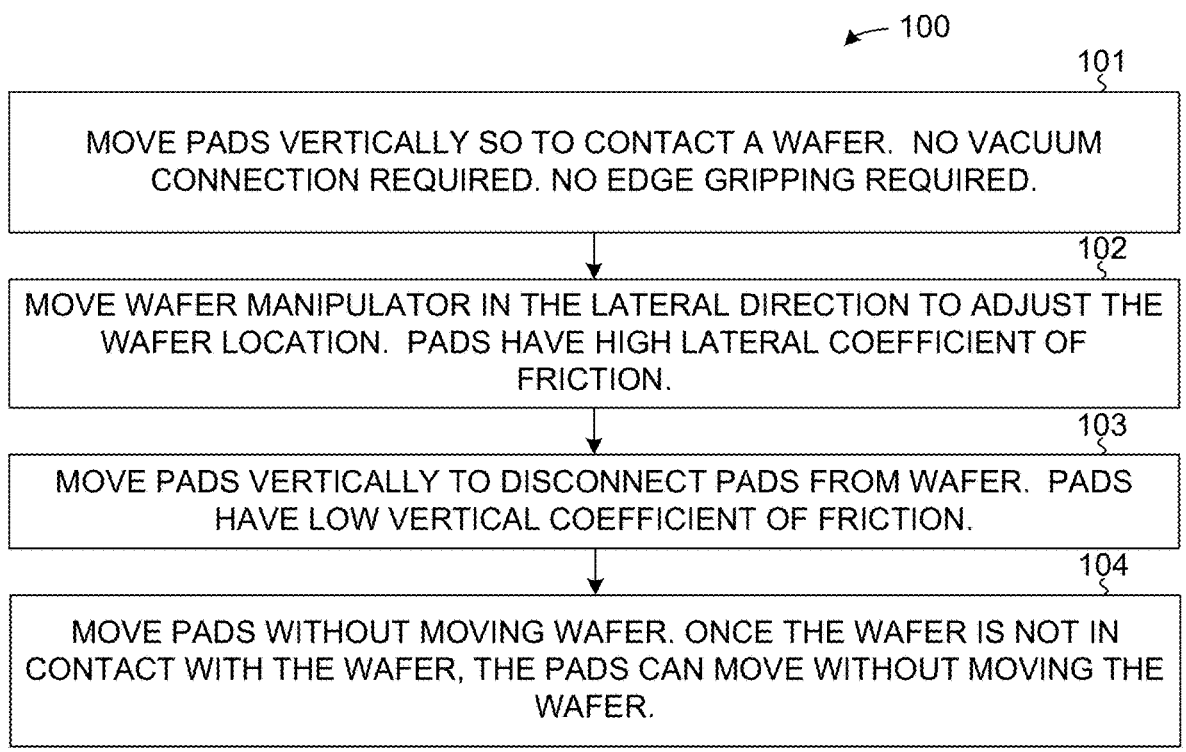
FIG. 5 is a flowchart 100 describing the operation of a low profile wafer manipulator.

FIG. 5 is a flowchart 100 describing the operation of a low profile wafer manipulator. In step 101, the pads are moved vertically so to contact a wafer. Neither vacuum connection nor edge gripping connection is required. In step 102, the wafer manipulator is moved in the lateral direction to adjust the wafer location. The wafer manipulator can move rapidly in the lateral direction (x-y direction) due to the high lateral coefficient of friction exhibited by the pads. In step 103, the pads are moved vertically to disconnect the pads from the wafer. This can be done easily as the pads have a very low vertical (z-direction) coefficient of friction. In step 104, the pads are moved without moving the wafer. Once the wafer is no longer in contact with the wafer, the pads can move without moving the wafer.

Figure 6:
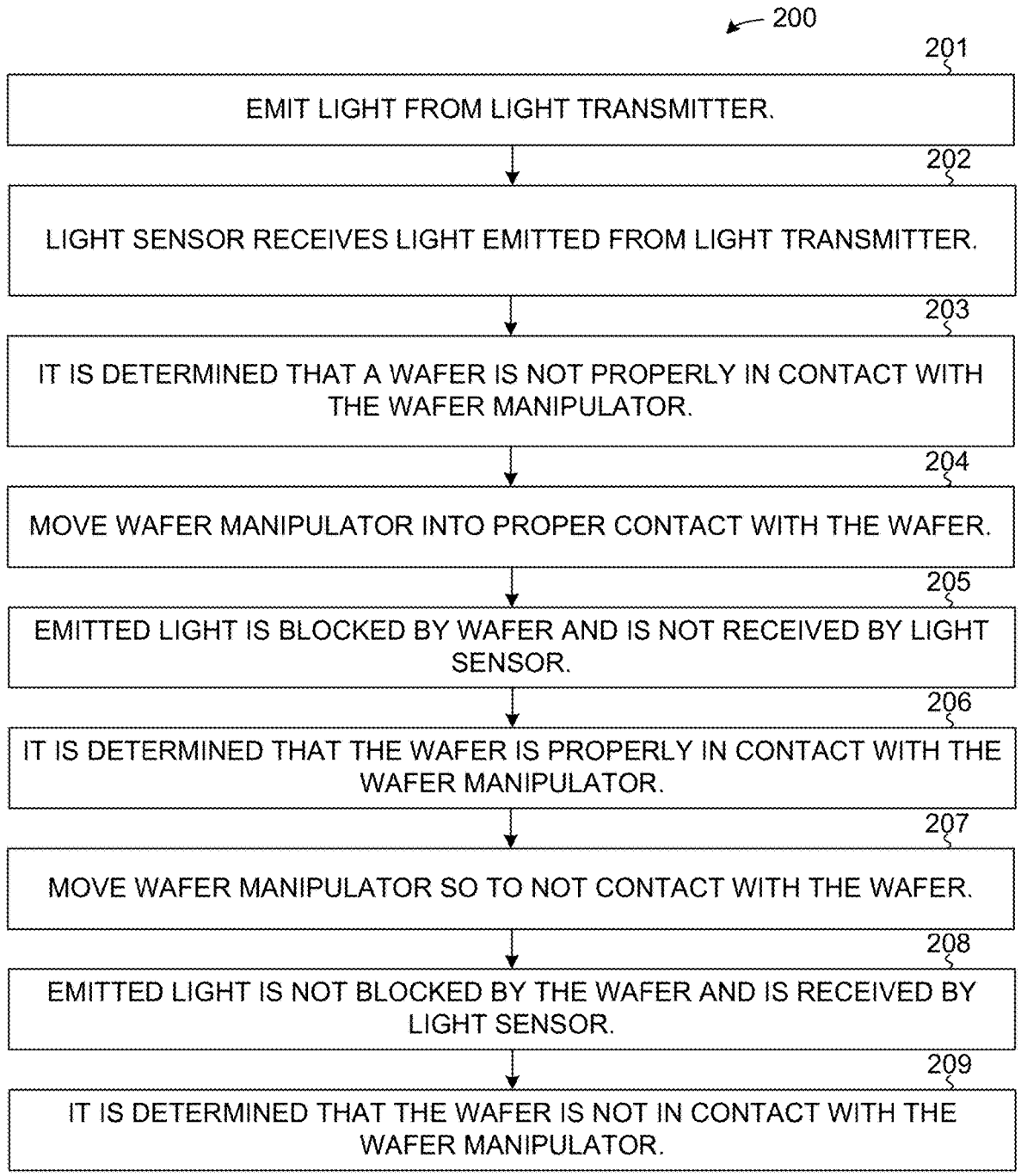
FIG. 6 is a flowchart 200 describing the operation of wafer sensing.

FIG. 6 is a flowchart 200 describing the operation of wafer sensing. In step 201, light is emitted from a light transmitter. In step 202, a light sensor receives light emitted from the light transmitter. In step 203, it is determined that a wafer is not properly in contact with the wafer manipulator. In step 204, the wafer manipulator is moved into proper contact with a wafer. In step 205, the emitted light is blocked by the wafer and is not received by the light sensor.

In step 206, it is determined that the wafer is properly in contact with the wafer manipulator. In step 207, the wafer manipulator is moved so to not contact the wafer. In step 208, the emitted light is not blocked by the wafer and is received by the light sensor. In step 209, it is determined that the wafer is not in contact with the wafer manipulator.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A wafer manipulator, comprising:
    a base;
    a first arm connected to the base;
    a second arm connected to the base;
    a first pad, connected to the first arm, to hold a wafer;
    a second pad, connected to the second arm, to hold the wafer;
    a light transmitter to transmit light; and
    a light sensor on the base that is configured to receive light transmitted from the light transmitter when the wafer is not properly in contact with the wafer manipulator but not when the wafer is properly in contact with the wafer manipulator.

2. The wafer manipulator of claim 1, wherein the first pad has a horizontal friction and a vertical friction, wherein the horizontal friction is at least ten times greater than the vertical friction.

3. The wafer manipulator of claim 1, wherein the first pad is connected to the first arm using adhesive.

4. The wafer manipulator of claim 1, wherein the first pad is connected to the first arm using a bolt, a screw, a nail, a pin, a lock, or a rivet.

5. The wafer manipulator of claim 1, wherein multiple pads including the first pad are attached to the first arm to hold the wafer, and wherein multiple pads including the second pad are attached to the second arm to hold the wafer.

6. The wafer manipulator of claim 1, wherein the light transmitter and the light sensor are configured such that the light transmitted from the light transmitter is blocked by the wafer before irradiating the light sensor when the wafer is properly in contact with the wafer manipulator.

7. The wafer manipulator of claim 1, wherein the light transmitter and the light sensor are configured such that the light transmitted from the light transmitter is not blocked by the wafer before irradiating the light sensor when the wafer is not properly in contact with the wafer manipulator.

8. The wafer manipulator of claim 1, wherein the first arm is formed from stainless steel.

9. The wafer manipulator of claim 1, wherein a maximum acceleration of the wafer in contact with the wafer manipulator is based on the horizontal coefficient of friction of the first pad and horizontal coefficient of friction of the second pad.

10. The wafer manipulator of claim 1, further comprising:
    an output port in the base to output a signal that indicates the amount of light sensed by the light sensor.

11. The wafer manipulator of claim 10, wherein a computer is to receive the signal and determine if the wafer is in contact with the wafer manipulator.

12. The wafer manipulator of claim 10, wherein a computer is to receive the signal and determine how to move the wafer in contact with the wafer manipulator.

13. The wafer manipulator of claim 1, wherein the wafer manipulator does not include a vacuum.

14. The wafer manipulator of claim 1, wherein the wafer manipulator does not include an edge gripper.

15. The wafer manipulator of claim 1, wherein the first pad is a Cylium structure.

16. The wafer manipulator of claim 1, wherein the first arm, the second arm, and the body are parts of a single metal form.

17. The wafer manipulator of claim 1, wherein a robot, connected to the wafer manipulator, is to move the wafer manipulator.

18. The wafer manipulator of claim 17, wherein the robot comprises a computer to receive a signal output from the light sensor and to control the robot, at least in part.

19. The wafer manipulator of claim 18, wherein a height of the wafer manipulator is less than three-hundred micrometers.

20. The wafer manipulator of claim 19, wherein the wafer manipulator can move the wafer into a slot that is less than three-hundred micrometers in height.

* * * * *